(12) United States Patent
Smith

(10) Patent No.: US 7,155,818 B2
(45) Date of Patent: Jan. 2, 2007

(54) METHOD OF FABRICATING A CONNECTOR

(76) Inventor: Douglas W. Smith, 741 Westminster La., Los Altos, CA (US) 94022

( * ) Notice: Subject to any disclaimer, the term of this patent is extended or adjusted under 35 U.S.C. 154(b) by 200 days.

(21) Appl. No.: 10/953,158

(22) Filed: Sep. 29, 2004

(65) Prior Publication Data

US 2005/0039331 A1   Feb. 24, 2005

Related U.S. Application Data

(62) Division of application No. 10/297,860, filed as application No. PCT/US01/18484 on Jun. 8, 2001, now Pat. No. 6,997,762.

(60) Provisional application No. 60/212,396, filed on Jun. 19, 2000.

(51) Int. Cl.
  *H01R 9/00* (2006.01)
(52) U.S. Cl. .......................................... 29/842; 29/845
(58) Field of Classification Search ................ 29/842, 29/845, 874, 883, 884
  See application file for complete search history.

(56) References Cited

U.S. PATENT DOCUMENTS

| 3,623,037 | A | * | 11/1971 | Parks | 365/139 |
| 3,665,428 | A | * | 5/1972 | Olyphant et al. | 365/59 |
| 3,708,874 | A | * | 1/1973 | Parks | 29/604 |
| 3,771,220 | A | * | 11/1973 | Shannon et al. | 29/604 |
| 4,724,180 | A | | 2/1988 | Kern | |
| 5,174,763 | A | | 12/1992 | Wilson | |
| 5,354,219 | A | | 10/1994 | Wanjura | |
| 6,037,787 | A | | 3/2000 | Corwith | |

FOREIGN PATENT DOCUMENTS

GB   2 011 190   7/1979

OTHER PUBLICATIONS

International Search Report corresponding to application No. PCT/US01/18484 dated Jun. 2, 2002.

* cited by examiner

Primary Examiner—Carl J. Arbes
(74) Attorney, Agent, or Firm—RatnerPrestia

(57) ABSTRACT

In an electrically shielded connector, conductive material covers an outer surface of said body and is spaced away from a conductive structure included in the connector to create electrical isolation therebetween. A channel in which the connector is situated is either plugged when conductive material is applied to the connector during manufacturing or is counter bored to create the electrical isolation.

5 Claims, 3 Drawing Sheets

METHOD OF FABRICATING A CONNECTOR

FIELD OF THE INVENTION

This application is a divisional of application Ser. No. 10/297,860, filed May 9, 2003, now U.S. Pat. No. 6,997,762 which is a 371 of PCT/US01/18484, filed Jun. 8, 2001, which claims the benefit of Ser. No. 60/212,396, filed Jun. 19, 2000.

The present invention relates to an electrically shielded connector and in particular to an electrically shielded connector which is useful for interfacing test equipment. Specifically, an electrically shielded connector is disclosed which provides good conductivity and uniform impedance.

BACKGROUND OF THE INVENTION

To determine whether semiconductor devices have manufacturing defects, such devices are tested. Typically, an automatic test system having a test head is used to transmit appropriate signals to and receive signals from the device under test (DUT). Depending upon the stage in the manufacturing cycle, a device handler or a wafer prober may be used to automatically bring each device in turn into a position to be tested. The test head is docked with the wafer prober or device handler, and an interface unit is provided to convey the signals between the DUT and the test head.

In performing such tests, it is common for the test head to both transmit and receive signals that have low signal levels and high frequencies. Further, with increasing complexity of devices under test, the density of signal connections between the test head and the DUT similarly increases.

Thus, it is useful to provide a structure which provides sufficient shielding of signals flowing between the test head and the device handler.

Various devices are known in the prior art to provide shielding between the test head and the device handler. U.S. Pat. No. 6,037,787 (Corwith) discloses a probe interface which is formed from a plurality of metal tubes. The tubes are placed between insulative retainers. Furthermore, U.S. Pat. No. 4,724,180 (Kern) discloses an interface device in which channels are formed therein, and the entire device is coated with a nickel coating. It is desirable to insert conducting structures (such as pogo pin structures) in the channels disclosed in each respective patent. It also desirable, however, for certain conducting structures to not be in contact with the conductive layers. Thus, additional manufacturing steps are performed. Specifically, insulating layers (or spacers) may be needed about the conducting structures to prevent them from coming into contact with conductive members within the channels.

SUMMARY OF THE INVENTION

An electrically shielded connector includes: a body at least partially covered with conductive material and having at least two channels which extend between opposite ends of the body; and conductive structures situated in the channels. The conductive material covers an outer surface of the body and is spaced away from one of the conductive structures to create electrical isolation therebetween. At least one of the channels is at least partially covered with conductive material while at least another of the channels is non-conductive relative to the outer surface of the body. An area of one or more non-conductive materials extends from the conductive structure in the non-conductive channel to the conductive material covering the outer surface of the body.

In a method of fabricating a connector, a body is provided having a plurality of non-conductive channels. One of the channels is plugged and another of the channels is kept open. The body is exposed to conductive material so that the open channel is at least partially covered with the conductive material and the conductive material is excluded from the plugged channel. Conductive structures are then inserted in each of the channels.

DETAILED DESCRIPTION OF THE INVENTION

Figure 1:
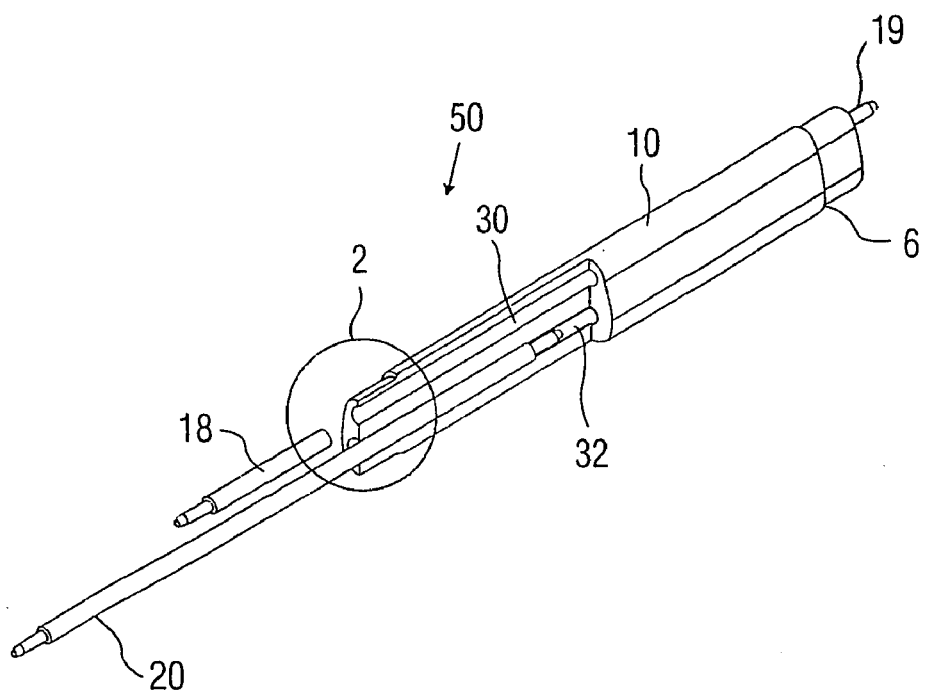
FIG. 1 is perspective view which includes a cut-away portion in accordance with an exemplary embodiment of the present invention.

An exemplary embodiment of the present invention is shown in FIG. 1. FIG. 1 is a perspective view in which a portion of the object depicted has been cut-away to show the interior. In the exemplary embodiment of the present invention, electrically shielded connector 50 includes a non-conductive (i.e., plastic) body 10. This plastic body may be formed from one or more components and may be, for example, injection molded. The outside of plastic body 10 is preferably covered with a conductive material. The conductive material is desirably gold. The material may be applied, for example, by electroplating. At least two hollow channels 30, 32 are formed in body 10. Channels 30, and 32 may, for example, extend between opposite ends of body 10. A plurality of conductive structures are situated within channels 30, 32. These conductive structures may be pogo pin structures which are well known to one skilled in the art. As shown, for example, in FIG. 1, pogo pin structure 18 may be inserted at one end of channel 30 while pogo pin structure 19 may be inserted at an opposite end of channel 30. Pogo pin structures 18 and 19 each have one pogo pin extending from one end, respectively. Furthermore, pogo pin structure 20 may extend all the way between opposite ends of channel 32. Pogo pin structure 20 may include two pogo pins, extending from opposite ends of pogo pin structure 20. Thus, as shown, it is possible to have either 2 separate conductive structures extending out of opposite ends of a channel (and not necessarily in direct mechanical contact with each other) or a single conductive structure extending the entire length between opposite openings of a channel.

Also as shown in FIG. 1, step shoulder 6 may be molded into each end of body 10 to facilitate assembly with a retainer, if desired.

Figure 2:
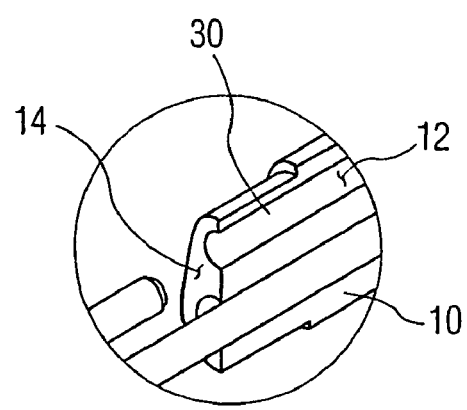
FIG. 2 shows a magnified view of a portion of FIG. 1.

FIG. 2 is a magnified view of a portion of FIG. 1. As shown in FIG. 2, the inside of channel 30 may be conductively plated (i.e., with gold). Thus, gold plating 12 may be included within channel 30 so that channel 30 may be used to conduct ground. The inside of channel 32 may be either conductively plated (i.e., with gold) or not conductively plated. Gold plating 12 may extend along the end of body 10 to form gold plating 14 on the exterior end of body 10. As body 10 is formed from one or more non-conductive components, an area of the non-conductive components extends from one (or either) plating within its respective channel to the plating on the exterior of body 10.

In an exemplary embodiment of the present invention, it is preferred that gold plating 12 extend throughout all of channel 30 so that all cross sections of channel 30 are consistent. This helps to create uniform impedance. In addition, it is also preferred to use a single pogo pin structure as opposed to two disconnected pogo pin halves because the single pogo pin structure will again provide more uniform impedance.

Figure 3:
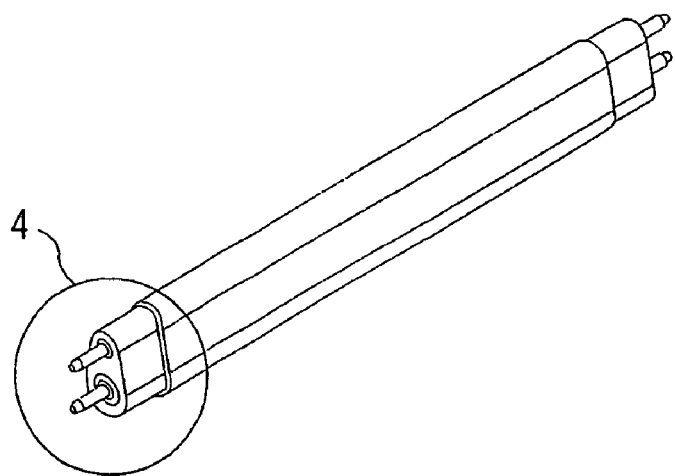
FIG. 3 is a perspective view of an exemplary embodiment of the present invention.

FIG. 3 shows electrically shielded connector 50 in perspective view.

Figure 4:
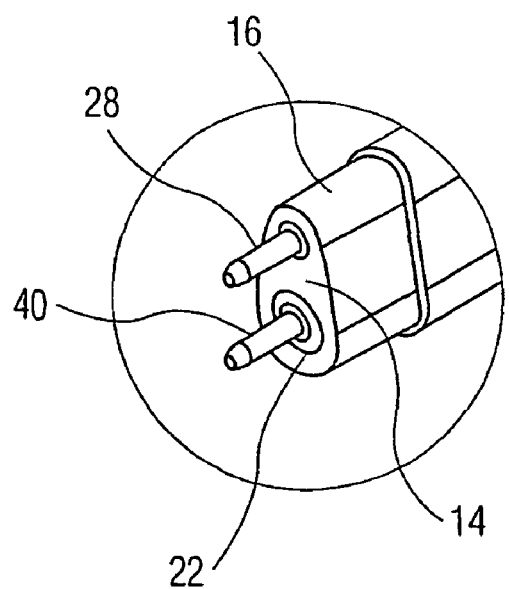
FIG. 4 is a magnified view of a portion of FIG. 3.

FIG. 4 shows a magnified portion of FIG. 3. As shown in FIG. 4, a gold plated exterior is included. Ground pogo pin 28 and signal pogo pin 40 are shown. Ground pogo pin 28 conveys ground potential while signal pogo pin 40 conveys a signal (e.g., a data signal). Both ground pogo pin 28 and signal pogo pin 40 may be pogo pins which extend from pogo pin structures 18 and 20, respectively. Other types of signal contacts may also be used. Space 22 is situated about pogo pin structure 20. There is electrical isolation between gold plate 14 and signal pogo pin 40. In this document "ground" is assumed in the broad sense of being a conducting connection to a reference potential and not necessarily a connection to earth.

Figure 5:
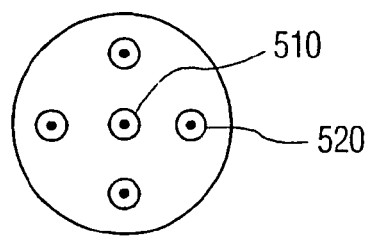
FIGS. 5–7 show exemplary pin/signal configurations.
Figure 6:
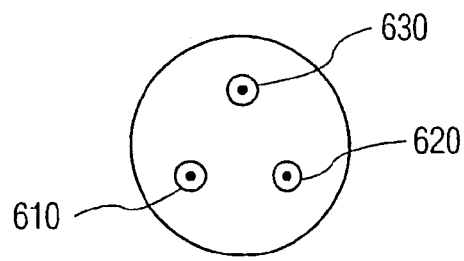
Figure 7:
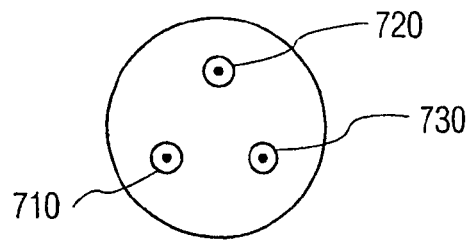

FIGS. 5–7 are end views showing other possible configurations of exemplary embodiments of the present invention. It is understood that these configurations are merely exemplary, and the invention is not limited to those configurations shown. In FIG. 5, a power pin 510 is situated in the middle and there are four (or less or more) ground pins 520 situated about the power pin in the middle. The purpose of this configuration is to provide many ground conductors. This may minimize, for example, ground bounce. As shown in FIG. 6, a signal pin 610 may be situated in an insulated channel. A guard pin 620 may also be situated in an insulated channel. A ground pin 630 may be situated in a plated channel.

As shown in FIG. 7, a configuration is shown which may be desirable for double-ended (differential) signals. Thus, there is a ground pin 710, a signal+pin (not coupled to ground) 720, and a signal-pin (also not coupled to ground) 730.

In an exemplary embodiment of the present invention, the edges between the ends and the sides of connector 50 may be rounded or chamfered. This will help to ensure that the gold plated layer is uniform and transitions from the sides of connector 50 to the ends of connector 50. This, in turn, ensures good connectivity. Similarly, the edge between the channel 30 and the ends of connector 50 may be chamfered or rounded to help ensure connectivity.

It is possible that it may be difficult to provide uniform plating throughout the entire length of channel 30. To have desirable uniform characteristic impedance of the signal that travels along pogo pin structure 20, the conducting layer (i.e., gold plating) on the inside of channel 30 is desirably uniform along its entire length. Therefore, in an exemplary embodiment of the present invention, it is useful to use a pogo pin structure with a double-ended pogo pin, whose outer tube effectively lines channel 30 with conductor. It is also desirable to provide enough plating on the end of channel 30 where it meets with the end of connector 50 to make a good electrical connection with the pogo pin structure 18, and consequently pogo pin 28. The pogo pin structure 18 may be inserted into channel 30 with a force or interference type fit. Alternatively, the pogo pin structure 18 could be held in place by other retention means such as conductive glue.

In an exemplary embodiment of the present invention, some space is provided between plating 14 and channel 32. This will help prevent signal pogo pin structure 20 from shorting to ground. Space 22 which is a concentric circle depicts this spacing. Space 22 does not necessarily have to be circular; it could be of any other shape which might prove to be convenient. When connector 50 is made, for example, the ends of channel 32 can be plugged with a plastic plug which has a shoulder that covers a portion of the end surface of connector 50 to keep it from becoming plated. Thus, conductive material covers at least a portion of the open channel and conductive material is excluded from the plugged channel. Alternatively, if channel 32 is not plugged (so that conductive material plates the interior of channel 32), it is possible to hit the ends of channel 32 with a counter sink or counter bore to remove the plating material. Alternatively, both of the above described methods may be used.

Signal pogo pin structure 20 may be inserted into channel 32 with, for example, a force or an interference fit. Alternatively, it could be held in place by other retention means such as a nonconductive glue.

The tubes of the pogo pin structures may be reverse dimpled at one or both ends. That is, a slight bulge is formed near the end of the tube. This is called a flaring or bulging and it forms a ridge with a height of, for example, 1 to 2 mills. This may assist in assembly. The bulge portion provides a force fit, allowing most of the tube to be slid easily into the respective channel. The diameter of the channel may be made smaller at one end than at the other end. Then, the pogo pin structure would slide in easily almost all of the way and then snap in with a force type fit for the final distance of travel of insertion.

The exemplary embodiment has been described with regard to gold plating. It is understood that other material may be used for plating as long as it is conductive. Also, in place of plating, another type of conductive structure (i.e., the tube of structure 18 or another tube) may be used for carrying the ground signal between opposite ends of connector 50.

As an alternative to forming hollow channels in the molded body into which pogo pin structures are inserted, conductive tubes may be molded into the body. That is, the tubes are first placed into the mold and the plastic material is then molded around them. Such tubes could be the outer tubes of pogo pin structures. Or more generally, pogo pin or other suitable contact assemblies may be placed into the tubes. Appropriate steps are taken to ensure that in the subsequent plating process that a good electrical connection is made between the tube in the place of ground channel 30 and the plating 14 on the exterior of plastic body 10. Also appropriate steps are taken, by for example the use of plugs or machining steps such as described above, to ensure that no electrical connection is made between the plating 14 and the tube in the place of signal channel 32.

Figure 8:
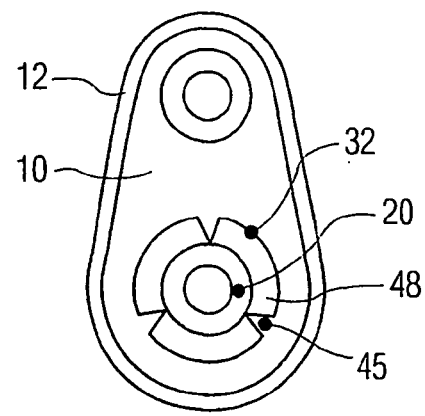
FIG. 8 is a cross sectional view which illustrates a further exemplary embodiment of the present invention.

FIG. 8 is a cross sectional view of a connector in accordance with an alternative embodiment of the present invention. In this alternative embodiment, a space 48 is defined about pogo pin structure 20. The term "space", being used here, refers to an area in the channel, i.e., between the inner wall of the channel and the outer wall of pogo pin structure 20. Thus, space 48 may be an empty space filled with, for example, air. Alternatively, space 48 may be filled with another type of gas, a liquid, or even a solid member.

The purpose of space 48 is to provide a different characteristic impedance than would be obtained if space 48 were not provided. Thus, if space 48 is not provided, then the inner walls of channel 32 and the outer walls of pogo pin structure 20 completely touch so that nothing could be situated therebetween.

Use of space 48 may be explained through the following. If body 10 is comprised of a non conductive material having a relative permittivity greater than 1, and if space 48 does not exist between pogo pin structure 20 and body 10, a resulting characteristic impedance $Z_1$ may be obtained. If the above structure is modified so that space 48 is included, pogo pin structure 20 will be situated next to a material (gas such as air, liquid or solid) with a different relative permittivity. The resulting characteristic impedance is accordingly changed. The greater the distance from the outside surface of pogo pin structure 20 to the insider surface of channel 32, the greater the change in characteristic impedance.

In the exemplary embodiment shown in FIG. 8, splines 45 have been formed in channel 32 when the body was molded. These splines may run, for example, the entire length of the channel. As shown, they serve to define space 48 between the outer surface of pogo pin structure 20 and certain inner surfaces of channel 32.

It is understood to one of ordinary skill in the art that other techniques can be used to define space 48. For example, dimples or bumps could be formed at various locations within channel 32. Washers or retainers could be used at each end of channel 32 to hold the conductor structure at least substantially centered within channel 32 having an opening which is larger than pogo pin structure 20. The washer or retainers could be made of conducting material as long as they do not come in contact with external plating 12. Alternatively, an insulating sleeve of appropriate dielectric constant could be placed in space 48 and about pogo pin structure 20.

With the above embodiments, connector 50 may be used to transmit and receive data signals between, for example, a test head and a device under test.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A method of fabricating a connector, said method comprising the steps of:
   providing a body having a plurality of non-conductive channels;
   exposing said body to conductive material so that said channels are at least partially covered with said conductive material;
   counter boring or countersinking one of said channels, said counter boring or countersinking removing a portion of said conductive material from the one of said channels; and
   inserting conductive structures in each of said channels.

2. A method of fabricating a connector according to claim 1, wherein said step of exposing said body to conductive material covers an exterior surface of said body with said conductive material.

3. A method of fabricating a connector according to claim 1, wherein said step of providing said body includes a step of molding said body.

4. A method of fabricating a connector according to claim 3, wherein a spacing member is situated in said channel so that an area is defined about one of said conductive structures.

5. A method of fabricating a connector, said method comprising the steps of:
   providing a body having a plurality of non-conductive channels;
   exposing said body to conductive material so that an outside of said body and one of said channels is at least partially covered with said conductive material;
   counter boring or countersinking one of said channels, said counter boring or countersinking removing a portion of said conductive material from the one of said channels; and
   inserting conductive structures in each of said channels so that an area of one or more non-conductive materials extends from one of said structures inserted in said one of said channels which has been counter bored to said conductive material outside of said body.

* * * * *

UNITED STATES PATENT AND TRADEMARK OFFICE
CERTIFICATE OF CORRECTION

| | | |
|---|---|---|
| PATENT NO. | : 7,155,818 B2 | Page 1 of 1 |
| APPLICATION NO. | : 10/953158 | |
| DATED | : January 2, 2007 | |
| INVENTOR(S) | : Douglas W. Smith | |

It is certified that error appears in the above-identified patent and that said Letters Patent is hereby corrected as shown below:

Cover Page:

At Item (73) Assignee: Insert --InTEST IP Corporation, Cherry Hill, New Jersey--.

Signed and Sealed this

Second Day of August, 2011

David J. Kappos
*Director of the United States Patent and Trademark Office*